United States Patent [19]

Misheloff

[11] Patent Number: 5,559,715
[45] Date of Patent: Sep. 24, 1996

[54] TIMING MODEL AND CHARACTERIZATION SYSTEM FOR LOGIC SIMULATION OF INTEGRATED CIRCUITS WHICH TAKES INTO ACCOUNT PROCESS, TEMPERATURE AND POWER SUPPLY VARIATIONS

[75] Inventor: Michael N. Misheloff, Dublin, Calif.

[73] Assignee: VLSI Technology, Inc., San Jose, Calif.

[21] Appl. No.: 219,585

[22] Filed: Mar. 28, 1994

Related U.S. Application Data

[63] Continuation-in-part of Ser. No. 849,242, Mar. 11, 1992.
[51] Int. Cl.$^6$ .................................................. G06F 17/10
[52] U.S. Cl. ........................... 364/488; 364/489; 364/490; 364/578
[58] Field of Search ................................... 364/488, 489, 364/490, 491, 578, 581, 608

[56] References Cited

U.S. PATENT DOCUMENTS

| | | | |
|---|---|---|---|
| 4,063,080 | 12/1977 | Eichelberger et al. | 324/73.1 |
| 4,688,947 | 8/1987 | Blaes et al. | 368/120 |
| 4,924,430 | 5/1990 | Zasio et al. | 364/578 |
| 5,014,226 | 5/1991 | Horstmann et al. | 364/489 |
| 5,274,568 | 12/1993 | Blinne et al. | 364/489 |
| 5,392,227 | 2/1995 | Hiserote | 364/578 |
| 5,396,615 | 3/1995 | Tani | 364/DIG. 2 |
| 5,416,719 | 5/1995 | Pribetich | 364/489 |

FOREIGN PATENT DOCUMENTS

WO92/04684  3/1992  WIPO.

OTHER PUBLICATIONS

Kovacs F. & Hosszu, G. *Semiconductor Device Parameter Extraction based on Reconfigurable Ring Oscillator Freq. Meas.*, IEEE Proc. 1991 Int. Conf. on Microelectronic Test Structures, vol. 4, Mar. 1991, pp. 221–224.

Bafleur, Buxo, Teixeira *A Logical Timing Simulator for CMOS Circuits Based on an Accurate Formulation of the Propagation Delay*, IEEE Conf. on Circuit Theory & Design, 1989, pp. 270–274.

Lin & Mead, "Signal Delay in General RC Networks", IEEE Trans on CAD, vol. CAD–3, No. 4, Oct. 1994; pp. 331–349.

R. W. Phelps, *Advanced Library Characterization for High Performance ASIC*, Proceedings of the IEEE International Asic Conference, 1991, pp. 15–3.1 through pp. 15–3.4.

Michael N. Misheloff, *Improved Modelling and Characterization System for Logic Simulation*, IEEE (0-7803-0768-2), 1992, pp. 331–334.

Primary Examiner—Kevin J. Teska
Assistant Examiner—Tyrone V. Walker
Attorney, Agent, or Firm—Douglas L. Weller

[57] ABSTRACT

A method determines approximate propagation delay through logic devices within a library. Each logic cell within the library is characterized at baseline conditions to obtain parameters for each logic cell which define propagation delay through each logic cell at the baseline conditions. A subset of the logic cells are characterized at conditions varying from the baseline conditions to obtain scaling parameters. The scaling parameters modify values of the parameters for all logic cells within the library in order to approximate changes in propagation delay through each logic cell resulting from changes in the baseline conditions. In the preferred embodiment, the conditions varying from the baseline conditions includes a change in at least one of operating temperature, power supply voltage and process conditions.

23 Claims, 7 Drawing Sheets

TIMING MODEL AND CHARACTERIZATION SYSTEM FOR LOGIC SIMULATION OF INTEGRATED CIRCUITS WHICH TAKES INTO ACCOUNT PROCESS, TEMPERATURE AND POWER SUPPLY VARIATIONS

CROSS REFERENCE TO RELATED APPLICATION

This application is a continuation-in-part of copending application Ser. No. 07/849,242 filed Mar. 11, 1992.

BACKGROUND

The present invention concerns an accurate timing model for logic simulation of integrated circuits which takes into account process, temperature and power supply variations.

When designing an integrated circuit, it is generally desirable to simulate the functioning of logic circuitry within the integrated circuit. In order to accurately access the performance of the circuitry, it is additionally desirable that the logic simulation of logic include an accurate assessment of timing delays through the circuitry, at least in the critical paths.

In general, timing delays through circuitry are caused by propagation delays through and between logic cells which comprise the circuitry. The actual amount of propagation delay through and between logic cells is generally dependent on various capacitances within and between the logic cells, as well as the current available to charge or discharge the capacitances.

When developing a timing model, it is desirable to take into account the time delay introduced by charging the input capacitance of logic cells. This time delay is directly affected by the input current available to charge the input capacitance to the logic cell. This input current, in turn, is directly affected by the fan out of the output of the logic cell providing the input current.

In addition, process, temperature and power supply variations can also affect timing models. In the prior art, overall scaling factors have been used to take these into account. However, because different logic cells react differently to process, temperature and power supply variations, this has proved inaccurate. Alternately, it is possible to characterize every cell in a cell library at multiple process, temperature and power supply conditions. See R. W. Phelps, *Advanced Library Characterization for High Performance ASIC*, Proceedings of the IEEE International Asic Conference, 1991, pp. P15-3.1 through P15-3.4. While this does provide for a more accurate means to determine the effect of process, temperature and power supply variations, there is an enormous increase in the characterization time to determine the parameters.

SUMMARY OF THE INVENTION

In accordance with the preferred embodiment of the present invention, a method is presented for determining approximate propagation delay through logic devices within a library. Each logic cell within the library is characterized at baseline conditions to obtain parameters for each logic cell which define propagation delay through each logic cell at the baseline conditions. A subset of the logic cells are characterized at conditions varying from the baseline conditions to obtain scaling parameters. The scaling parameters modify values of the parameters for all logic cells within the library in order to approximate changes in propagation delay through each logic cell resulting from changes in the baseline conditions. In the preferred embodiment, the conditions varying from the baseline conditions includes a change in at least one of operating temperature, power supply voltage and process conditions. Also in the preferred embodiment, the subset of logic cells includes an inverter.

In the preferred embodiment of the present invention, operation of the logic device is divided into a first region and a second region. A boundary between the first region and the second is based on duration of input ramp to the logic device and amount of capacitive load driven by the logic device. For example, the boundary between the first region and the second occurs where for each value of the capacitive load, an output ramp for the logic device is one half complete when the input ramp is complete.

When the logic device operates in the first region, a first formula is used to obtain a first value representing delay through the logic device. The first formula varies the first value based on the duration of the input ramp to the logic device and the capacitive load driven by the logic device. When the logic device operates in the second region, a second formula is used to obtain the first value. The second formula also varies the first value based on the duration of the input ramp to the logic device and the capacitive load driven by the logic device.

In the preferred embodiment, the first formula has a form as follows:

$$DT_0 = A_0 D_0 *(\text{LOAD}) + FAT*B \text{ Min (INPUT RAMP, } CIR) + Z* \text{Max } (0, \text{INPUT RAMP} - CIR).$$

and the second formula has a form as follows:

$$DT_1 = A_1 + D_1 *(\text{LOAD}) + FAT*B* \text{Min (INPUT RAMP, } CIR) + B* \text{Max } (0, \text{INPUT RAMP} - CIR).$$

where $DT_0$ represents the first value, $DT_1$ represents the second value, INPUT RAMP represents duration of the input ramp, LOAD represents capacitive load driven by the logic device, CIR represents INPUT RAMP at the border between the first region and the second region for the LOAD, and $A_0$, $A_1$, B, Z, $D_0$, $D_1$ and FAT are coefficients determined using circuit simulations. The scaling parameters, in the preferred embodiment, include the following scaling parameters: $\alpha$, $\Delta\alpha+$, $\Delta\alpha-$, $\beta+$, $\beta-$, $\delta+$, $\delta-$, $\Delta\delta+$, $\Delta\delta-$, $\phi+$, $\phi-$, $\zeta+$ and $\zeta-$. The scaling parameters are defined as in the following formulae:

$$A_0' = \alpha * A_0$$

$$A_1' - A_0' = \Delta\alpha + *(A_1 - A_0) \text{ or } A_1' - A_0' = \Delta\alpha - *(A1 - A_0)$$

$$B' = \beta + *B \text{ or } B' = \beta - *B$$

$$D_0' = \delta + *D_0 \text{ or } D_0' = \delta - *D_0$$

$$D_1' - D_0' = \Delta\delta + *(D_1 - D_0) \text{ or } D_1' - D_0' = \Delta\delta - *(D_1 - D_0)$$

$$Z' = \zeta + *Z \text{ or } Z' = \zeta - *Z$$

$$FAT' = \phi + *FAT \text{ or } FAT' = \phi - *FAT$$

wherein $A_0'$, $A_1'$, $B'$, $D_0'$, $D_1'$, $Z'$ and $FAT'$ are new parameters resulting from the changes in the baseline conditions.

In the preferred embodiment, the scaling factors $\Delta\alpha+$, $\Delta\alpha-$, $\beta+$, $\beta-$, $\delta+$, $\delta-$, $\Delta\delta+$, $\Delta\delta-$, $\zeta+$ and $\zeta-$ are determined by characterizing an inverter. The scaling factor $\delta$ is characterized using a logic cell with at least four stages between input and output pins. For example, α is determined using a ratio of $A_0$ at different conditions, $\Delta\alpha+$ is determined using a ratio of $A1-A_0$ for rising output at different conditions, $\Delta\alpha-$ is determined using a ratio of $A1-A_0$ for falling output at different conditions, $\beta+$ is determined using a ratio of B for rising input at different conditions, $\beta-$ is determined using a ratio of B for falling input at different conditions, $\delta+$ is determined using a ratio of $D_0$ for rising output at different conditions, $\delta-$ is determined using a ratio of $D_0$ for falling output at different conditions, $\Delta\delta+$ is determined using a ratio of $D1-D_0$ for rising output at different conditions, $\Delta\delta-$ is determined using a ratio of $D1-D_0$ for falling output at different conditions, $\zeta+$ is determined using a ratio of Z for rising input at different conditions, $\zeta-$ is determined using a ratio of Z for falling input at different conditions, a scaling parameter $\phi+$ is determined using a ratio of FAT for rising input at different conditions, and a scaling parameter $\phi-$ is determined using a ratio of FAT for falling input at different conditions.

Also, in the preferred embodiment, each of the scaling parameters is a product of three terms, the three terms being a first term for temperature, a second term for power supply and a third term for process condition. Also, CIR is determined by the following formula:

$$CIR=\frac{1}{2}*[A_0+A_1+(D_0+D_1)*(LOAD)]/[1-FAT*B].$$

In an alternate embodiment, the first formula use first order linear approximations and have a form as follows:

$$DT_0=A_0+B*(INPUT\ RAMP)+D_0*(LOAD)$$

where $DT_0$ represents the first value, INPUT RAMP represents duration of the input ramp, LOAD represents capacitive load driven by the logic device, and $A_0$, B and $D_0$ are coefficients determined using circuit simulations.

Similarly, the second formula may have a form as follows:

$$DT_0=A0+B*(CIR)+D_0*(LOAD)+Z*(INPUT\ RAMP-CIR)$$

where CIR represents INPUT RAMP at the border between the first region and the second region for the LOAD, and Z is determined using circuit simulations.

Alternately a second order approximation of the input ramp may include "tails" of the input ramp. Using the second order model, the first formula may have a form as follows:

$$DT_0=A_0+FAT*B*(INPUT\ RAMP)+D_0*(LOAD)$$

wherein $DT_0$ represents the first value, INPUT RAMP represents duration of the input ramp, LOAD represents capacitive load driven by the logic device, and $A_0$, B, $D_0$ and FAT are coefficients determined using circuit simulations.

Similarly, using the second order model, the second order model may have a form as follows:

$$DT_0=DT_{0(CIR)}+Z*(INPUT\ RAMP-CIR)$$

wherein CIR represents INPUT RAMP at the border between the first region and the second region for the LOAD, Z is a coefficient determined using circuit simulations, and $DT_{(CIR)}$ is the first value when the logic ramp has an input ramp equal to CIR and a load equal to LOAD.

In the alternate preferred embodiment of the present invention, the method also includes calculating a next input ramp for a next logic device coupled to an output of the logic device. When the logic device operates in the first region, a third formula is used to generate a second value representing duration from beginning of the input ramp of the logic device to an end of an output ramp of the logic device. The second value is based on the length of the input ramp to the logic device and the amount of the load driven by the logic device. When the logic device operates in the second region, a fourth formula is used to generate the second value. The first value is then subtracted from the second value to obtain the next input ramp.

For example, the third formula may have a form as follows:

$$DT_1=A_1+B*(INPUT\ RAMP)+D_1*(LOAD)$$

where $DT_1$ represents the second value, and $A_1$ and $D_1$ are coefficients determined using circuit simulations. Similarly, the fourth formula may have a form as follows:

$$DT_1=A_1+B*(INPUT\ RAMP)+D_1*(LOAD).$$

Alternately, using the second order model which takes into account "tails" of the input ramp, the third formula may have a form as follows:

$$DT_1=A_1+FAT*B*(INPUT\ RAMP)+D_1*(LOAD)$$

wherein $DT_1$ represents the second value, and $A_1$ and $D_1$ are coefficients determined using circuit simulations. Similarly, using the second order model, fourth formula may have a form as follows:

$$DT_1=DT_{1(CIR)}+B*(INPUT\ RAMP-CIR).$$

The present invention is advantageous over the prior art in that it allows for accurate and efficient description of the variation of integrated timing with respect to process, temperature and power supply variations. Additionally, this accuracy is achieved without an enormous increase in the characterization time to determine the scaling parameters.

DESCRIPTION OF THE PREFERRED EMBODIMENT

Figure 1:
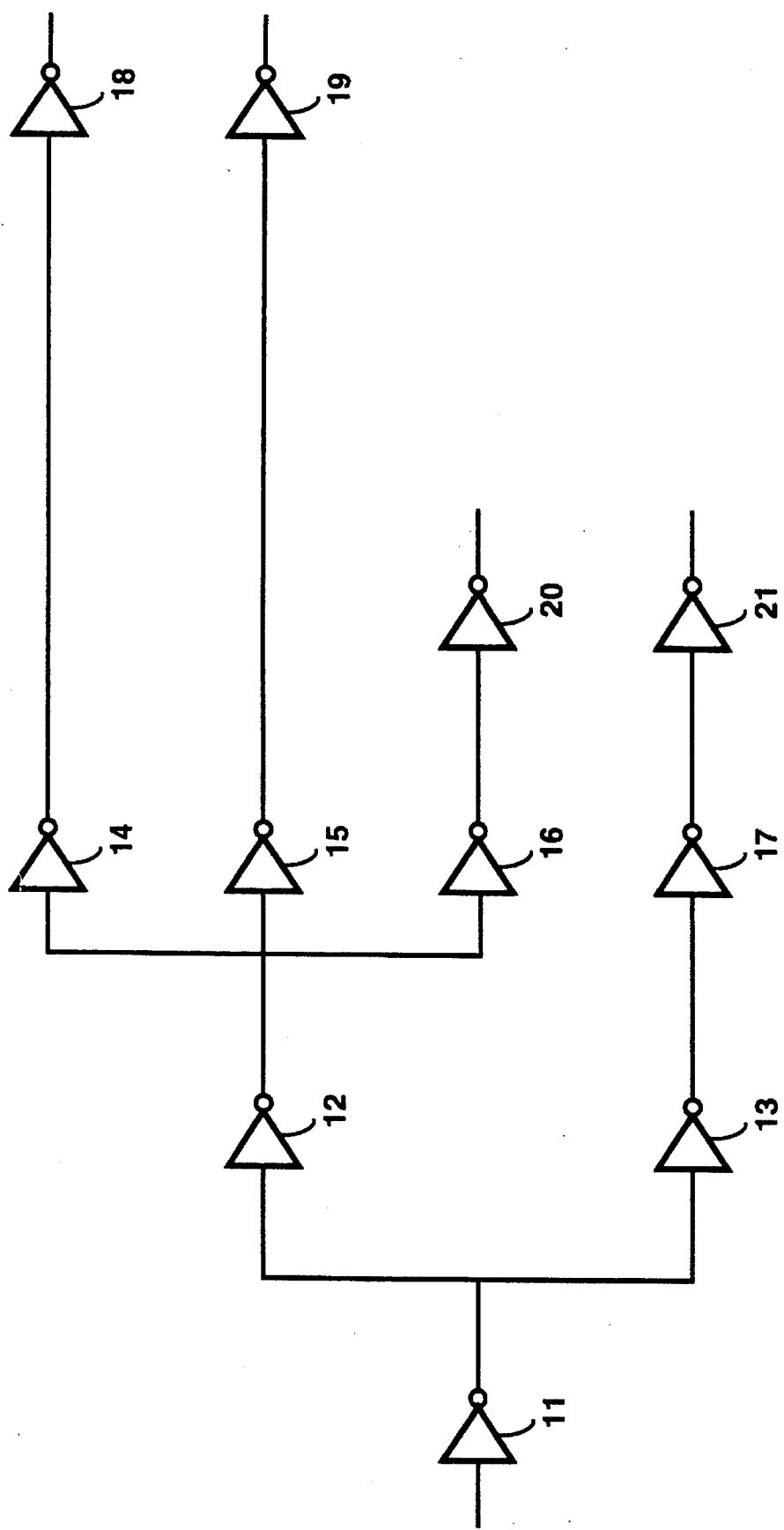
FIG. 1 shows an example of circuitry through which propagation delay may be calculated.

There are many causes of propagation delay through logic circuitry. For example, FIG. 1 shows circuitry which includes a logic device 11, a logic device 12, a logic device 13, a logic device 14, a logic device 15, a logic device 16, a logic device 17, a logic device 18, a logic device 19, a logic device 20 and a logic device 21 connected as shown. For simplicity in the discussion of the present invention, inverters are used for the logic devices. However, the present invention is applicable to all logic devices used in the manufacture of integrated circuits.

Causes for propagation delay through the circuitry shown in FIG. 1 include, for example, the time required to charge or discharge internal capacitance within each of logic devices 11–21, the time required to charge or discharge input capacitance to each of logic devices 11–21, and the time required to overcome inductance in the lines between logic devices 11–21. The present invention, however, focuses on the effects that input transition time and output load has on propagation delay. The input transition time of a logic device is the time required to charge or discharge input capacitance of the logic device. The output load is the total amount of capacitance which the logic device has to charge or discharge. The output load is directly affected by, for example, the fan out of the output of the logic device.

For example, as shown in FIG. 1, logic device 11 has a fan out of two. Logic device 12 has a fan out of three. Logic devices 13–17 have a fan out of one. Because of the relatively large fan out of logic device 12, it is expected that the output transition time of (and thus the propagation delay through) logic device 12 will take longer than, for example, the output transition time of logic device 13, which has a fan-out of only one.

Figure 2:
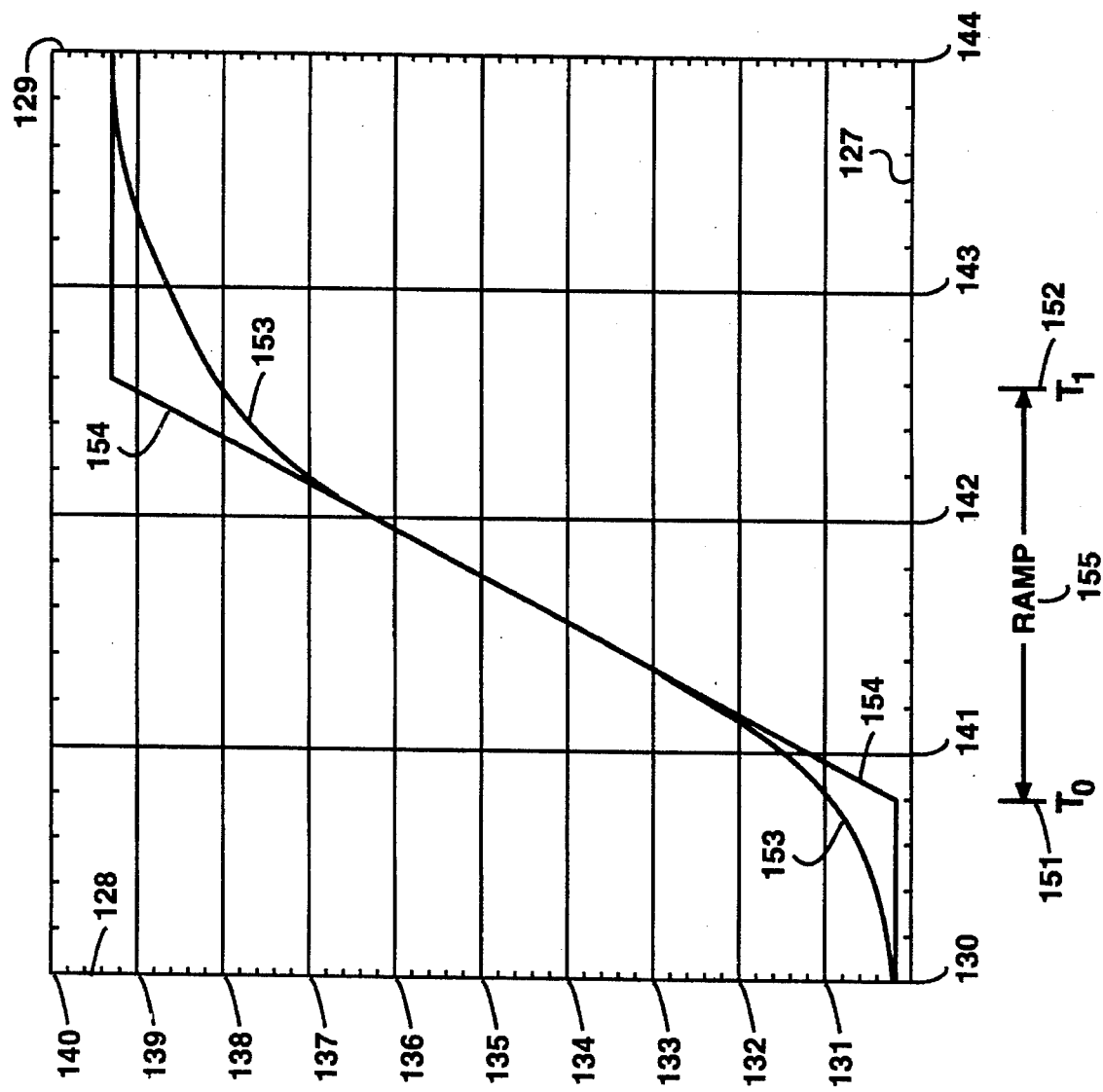
FIG. 2 shows a graph on which is superimposed a ramp waveform.

FIG. 2 shows a graph 129 on which is superimposed a ramp waveform 153 which represents a voltage ramp during a transition period. A vertical axis 128 of graph 129 represents voltage at an input or an output of a logic device. A horizontal axis 127 represents passage of time. A zero point 130 of graph 129 indicates zero voltage and the passage of zero nanoseconds. A point 141 on horizontal axis 127 represents the passage of 2.5 nanoseconds. A point 142 on horizontal axis 127 represents the passage of 5.0 nanoseconds. A point 143 on horizontal axis 127 represents the passage of 7.5 nanoseconds. A point 144 on horizontal axis 127 represents the passage of 10.0 nanoseconds. A point 131 on vertical axis 128 represents 0.5 volts. A point 132 on vertical axis 128 represents 1.0 volts. A point 133 on vertical axis 128 represents 1.5 volts. A point 134 on vertical axis 128 represents 2.0 volts. A point 135 on vertical axis 128 represents 2.5 volts. A point 136 on vertical axis 128 represents 3.0 volts. A point 137 on vertical axis 128 represents 3.5 volts. A point 138 on vertical axis 128 represents 4.0 volts. A point 139 on vertical axis 128 represents 4.5 volts. A point 140 on vertical axis 128 represents 5.0 volts.

Ramp waveform 153 shows voltage verses time for a transition from low to high. Ramp waveform 153 may be approximated by a waveform 154. Waveform 154 approximates as a straight line the transition of ramp waveform 153 from a low voltage to a high voltage. The total transition time 155, or ramp, of ramp waveform 153 is defined as the duration of time between a time 151 ($T_0$), which is the point at which waveform 154 begins to increase in voltage, and a time 152 ($T_1$), which is the point at which waveform 154 ceases to increase in voltage.

Figure 3:
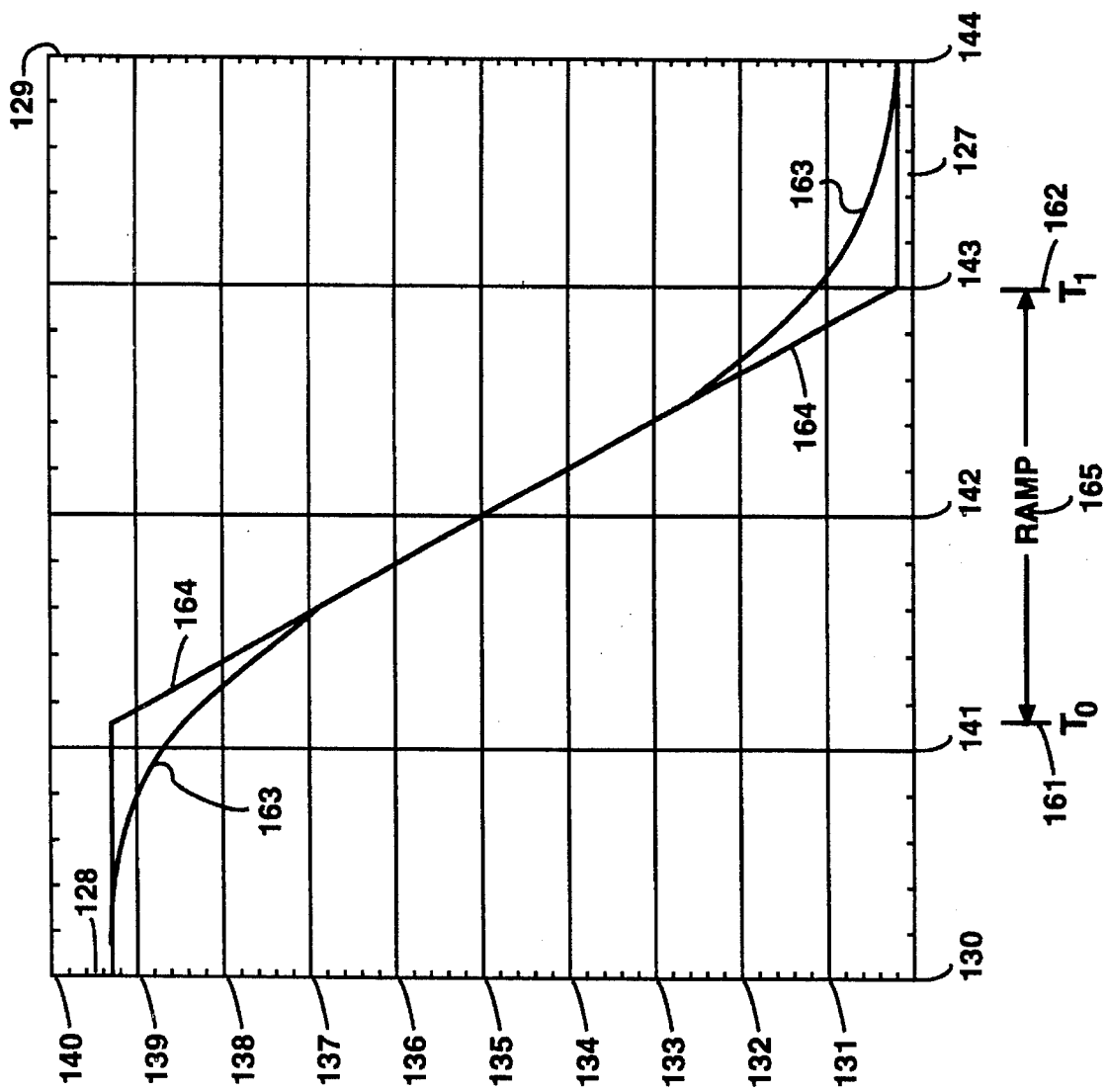
FIG. 3 shows a graph on which is superimposed a ramp waveform.

FIG. 3 shows a ramp waveform 163 superimposed on graph 129. Ramp waveform 163 shows voltage verses time for a transition from high to low. Ramp waveform 163 may be approximated by a waveform 164. Waveform 164 approximates as a straight line the transition of ramp waveform 163 from a high voltage to a low voltage. The total transition time 156, or ramp, of ramp waveform 163 is defined as the duration of time between a time 161 ($T_0$), which is the point at which waveform 164 begins to decrease in voltage, and a time 162 ($T_1$), which is the point at which waveform 164 ceases to decrease in voltage.

The terminology introduced in the discussion of FIGS. 2 and 3 may be used in the general description of input and output transition timing for a logic cell. For an input pin i (not shown) of a logic cell, the beginning of a ramp is defined as $T_{0,i}$ and the end of the ramp is defined as $T_{1,i}$. For an output pin j (not shown) of a logic cell, the beginning of a ramp is defined as $T_{0,j}$ and the end of the ramp is defined as $T_{1,j}$. Using this terminology, 50%–50% propagation delay (Tau) between input pin i and output pin j, is given by the following Formula 1:

$$Tau, ij = \tfrac{1}{2}(T_{1,j} + T_{0,j}) - \tfrac{1}{2}(T_{1,i} + T_{0,i})$$ Formula 1

While it is often the case that propagation delay is calculated using Tau, for the present invention, other calculated values may also be used. For example, the value $DT_0$ is defined as the difference in time between the beginning of the ramp for the input and the beginning of the ramp for the output. More generally, the value $DT_0$ between input pin i and output pin j is described by the following Formula 2:

$$DT_{0,ij} = T_{0,j} - T_{0,i}$$ Formula 2

The value $DT_1$ is defined as the difference in time between the beginning of the ramp for the input and the end of the ramp for the output. More generally, the value $DT_1$ between input pin i and output pin j is described by the following Formula 3:

$$DT_{1,ij} = T_{1,j} - T_{0,i}$$ Formula 3

Figure 4:
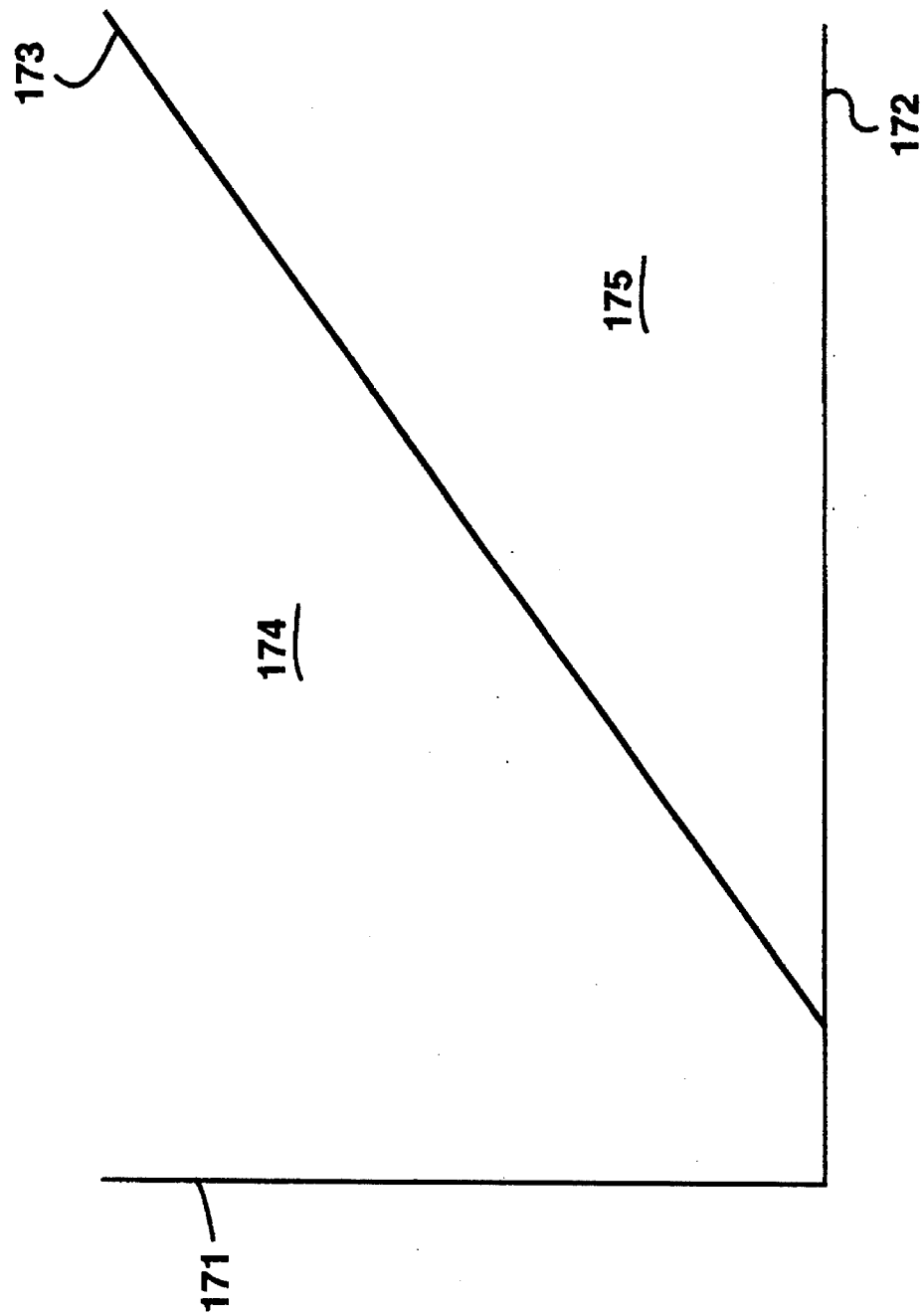
FIG. 4 shows two operation regions for a logic device in accordance with the preferred embodiment of the present invention.

For the present invention, two regions of operation of a logic device are considered. These regions are shown in FIG. 4. In FIG. 4, a vertical axis 171 represents increases in output load for the logic device. An axis 172 represents increase in time duration for the input ramp of the input ramp. A first region 174 is referred to as the fast input ramp region because in this region the input ramp rises relatively fast in comparison to the output ramp. A second region 175 is referred to as the slow input ramp region because in this region the input ramp rises relatively slowly in comparison to the output ramp. A dividing line 173 between fast input ramp region 174 and slow input ramp region 175 may be determined empirically as further discussed below.

Figure 5:
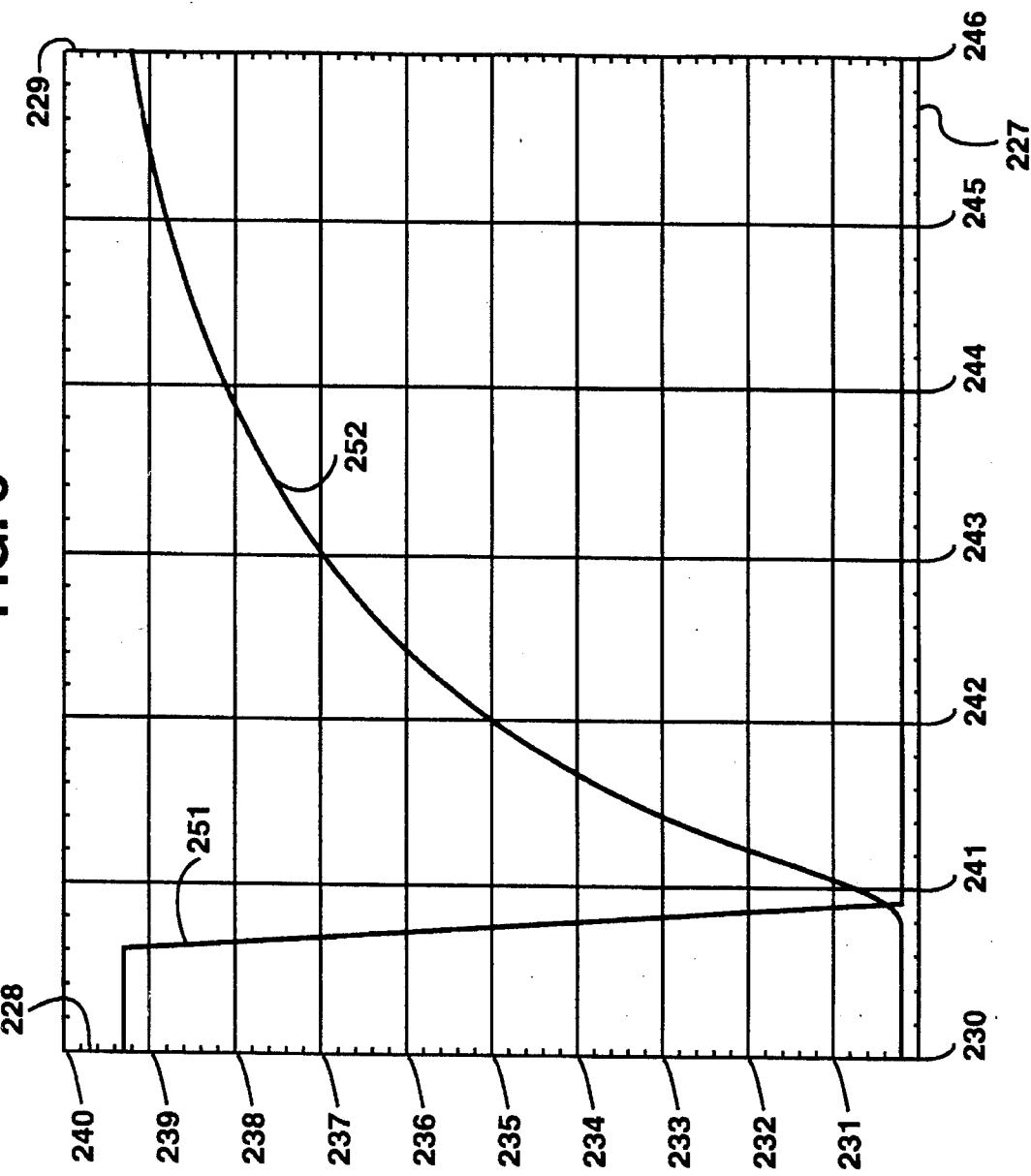
FIG. 5 shows a graph on which is superimposed an input ramp waveform and a resulting output ramp waveform in a first operation region shown in FIG. 4 in accordance with the preferred embodiment of the present invention.

FIG. 5 shows an example of an input ramp 251 and a resulting output signal waveform 252 in fast input ramp regions 174. As may be seen from FIG. 5, input ramp 251 falls at a relatively fast rate as compared to the rate of the rise of output signal waveform 252.

Input ramp 251 and output signal waveform 252 are superimposed on a graph 229. A vertical axis 228 of graph 229 represents voltage. A horizontal axis 227 represents passage of time. A zero point 230 of graph 229 indicates zero voltage and the passage of zero nanoseconds. A point 241 on horizontal axis 227 represents the passage of 1.67 nanoseconds. A point 242 on horizontal axis 227 represents the passage of 3.33 nanoseconds. A point 243 on horizontal axis 227 represents the passage of 5.00 nanoseconds. A point 244 on horizontal axis 227 represents the passage of 6.67 nanoseconds. A point 245 on horizontal axis 227 represents the passage of 8.33 nanoseconds. A point 246 on horizontal axis 227 represents the passage of 10.0 nanoseconds. A point 231 on vertical axis 228 represents 0.5 volts. A point 232 on vertical axis 228 represents 1.0 volts. A point 233 on vertical axis 228 represents 1.5 volts. A point 234 on vertical axis 228 represents 2.0 volts. A point 235 on vertical axis 228 represents 2.5 volts. A point 236 on vertical axis 228 represents 3.0 volts. A point 237 on vertical axis 228 represents 3.5 volts. A point 238 on vertical axis 228 represents 4.0 volts. A point 239 on vertical axis 228 represents 4.5 volts. A point 240 on vertical axis 228 represents 5.0 volts.

Figure 6:
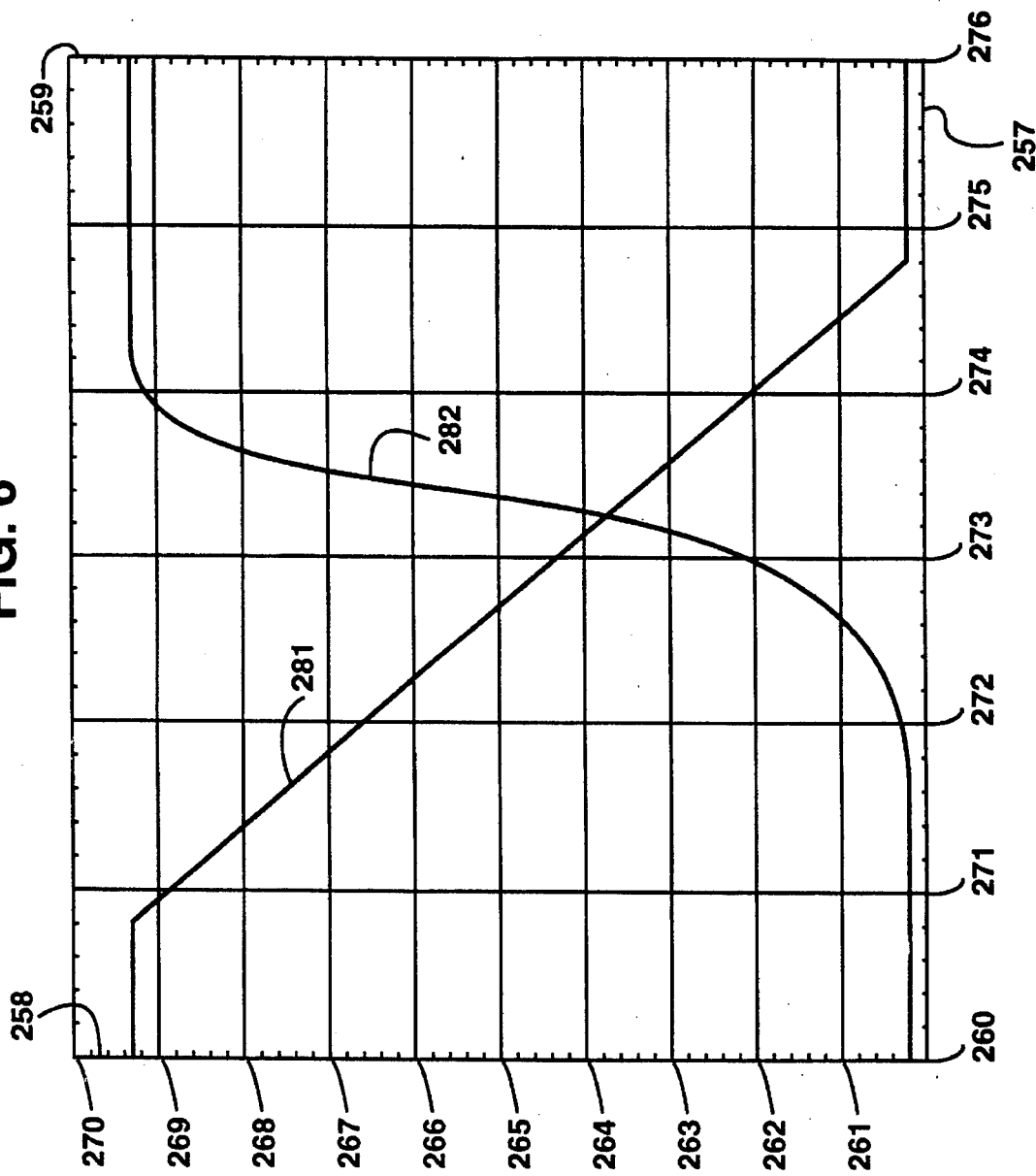
FIG. 6 shows a graph on which is superimposed an input ramp waveform and a resulting output ramp waveform in a second operation region shown in FIG. 4 in accordance with the preferred embodiment of the present invention.

FIG. 6 shows an example of an input ramp 281 and a resulting output signal waveform 282 in slow input ramp regions 175. As may be seen from FIG. 6, input ramp 281 falls at a relatively slow rate as compared to the rate of the rise of signal waveform 282.

Input ramp 281 and output signal waveform 282 are superimposed on a graph 259. A vertical axis 258 of graph 259 represents voltage. A horizontal axis 257 represents passage of time. A zero point 260 of graph 259 indicates zero voltage and the passage of zero nanoseconds. A point 271 on horizontal axis 257 represents the passage of 1.25 nanoseconds. A point 272 on horizontal axis 257 represents the passage of 2.5 nanoseconds. A point 273 on horizontal axis 257 represents the passage of 3.75 nanoseconds. A point 274 on horizontal axis 257 represents the passage of 5.0 nanoseconds. A point 275 on horizontal axis 257 represents the passage of 6.25 nanoseconds. A point 276 on horizontal axis 257 represents the passage of 7.5 nanoseconds. A point 261 on vertical axis 258 represents 0.5 volts. A point 262 on vertical axis 258 represents 1.0 volts. A point 263 on vertical axis 258 represents 1.5 volts. A point 264 on vertical axis 258 represents 2.0 volts. A point 265 on vertical axis 258 represents 2.5 volts. A point 266 on vertical axis 258 represents 3.0 volts. A point 267 on vertical axis 258 represents 3.5 volts. A point 268 on vertical axis 258 represents 4.0 volts. A point 269 on vertical axis 258 represents 4.5 volts. A point 270 on vertical axis 258 represents 5.0 volts.

In fast input ramp region 174, input ramp 251 is completed switched before output signal waveform 252 significantly changes. For a CMOS technology implementation of an inverter, one transistor of the output buffer of the inverter would be on in saturation and the other transistor of the output buffer of the inverter would be off during substantially all the time output signal waveform 252 switches. This is essentially equivalent to a constant current source charging or discharging the load capacitance. In the preferred embodiment of the present invention, for fast input region 174, value $DT_0$ and value $DT_1$ are approximated using the following Formula 4 and Formula 5, respectively:

$$DT_0 = A_0 + B*(\text{INPUT RAMP}) + D_0*(\text{LOAD}) \qquad \text{Formula 4}$$

$$DT_1 = A_1 + B*(\text{INPUT RAMP}) + D_1*(\text{LOAD}) \qquad \text{Formula 5}$$

In Formulas 4 and 5, values $A_0$, $A_1$, B, $D_0$ and $D_1$ are coefficients which may be determined empirically.

In slow input ramp region 175, input ramp 251 switches so slowly that output signal waveform 252 switches while input ramp 251 is still switching. For a CMOS technology implementation of an inverter, both transistors of the output buffer of the inverter are on when output signal waveform 252 switches. In the preferred embodiment of the present invention, for slow input region 175, value $DT_0$ and value $DT_1$ are approximated using the following Formula 6 and Formula 7, respectively:

$$DT_0 = A_0 + B*(CIR) + D_0*(\text{LOAD}) +$$

$$Z*(\text{INPUT RAMP} - CIR) \qquad \text{Formula 6}$$

$$DT_1 = A_1 + B*(\text{INPUT RAMP}) + D_1*(\text{LOAD}) \qquad \text{Formula 7}$$

In formula 6, the additional co-efficient Z is a proportionality factor calculated from the DC transfer function between the input voltage and the output voltage. In the slow ramp region, a plot of $DT_0$ versus the input ramp is a straight line for a given output load. Z is the slope of that line and can be calculated from the DC transfer curve. CIR is the INPUT RAMP for each load which is along dividing line 173 between fast input ramp region 174 and slow input ramp region 175. In the preferred embodiment of the present invention, the CIR (and thus dividing line 173) is defined to be at the point for each load where the end of the input ramp occurs at 50% of the output ramp. Since time 0 is considered to be at the beginning of the input ramp, then the end of the input ramp occurs at INPUT RAMP. Therefore, CIR occurs when INPUT RAMP equals $\frac{1}{2}*(DT_0+DT_1)$. CIR is therefore defined by the following Formula 8:

$$CIR = \frac{1}{2}*(DT_0+DT_1) \qquad \text{Formula 8}$$

The coefficients for the formulas may be calculated using circuit simulations. First, three circuit simulations are performed to determine values for the coefficients ($A_0$, $A_1$, B, $D_0$ and $D_1$) used in formula 4 and formula 5. In the circuit simulations values for load and input ramp are chosen so that the three circuit simulations will all fall within fast input ramp region 174. Actually, initially the location of dividing line 173 is not known so that the actual boundaries of fast input ramp region 174 are not known. Therefore, later in the model it is necessary to perform a check to see if the initial three circuit simulations were in fast input ramp region 174. If not, the circuit simulations are performed again using a faster input ramps and/or higher loads.

For each simulation, using formulas 2 and 3, $DT_0$ and $DT_1$ are found. Then using formulas 4 and 5, $A_0$, $A_1$, B, $D_0$ and $D_1$ may be calculated. A first consistency check may be done by solving formulas 4 and 5 separately for the coefficient B. If the coefficient B does not have the same value, then at least one of the circuit simulations was not in fast input ramp region 174.

From the calculated values for coefficients $A_0$, $A_1$, B, $D_0$ and $D_1$, using Formula 8, CIR is calculated. Once CIR is found, the chosen circuit simulations may again be checked to be sure they fall within fast input ramp region 174.

An additional circuit simulation is performed to find additional points on the DC transfer curve. From these points, the DC transfer function may be approximated. A linear approximation of the DC transfer function yields the proportionality constant Z.

In a manner similar to that described above, coefficients are calculated for each logic device type in a logic device library. Delay through a circuit built from logic devices in the logic device library may then be calculated. Total propagation delay through a circuit is the total amount of time for a signal to propagate through the circuit. The path of logic cells in a circuit through which a signal takes longest to propagate is called the critical path of the circuit. Total propagation for a circuit may be calculated by summing up the total delays through all logic cells in the critical path of the circuit.

Formula 1, for example, may be used to calculate delay through each logic cell. Additionally, starting with the input of the circuit and continuing through to the output of the circuit, the input ramp and the resulting output ramp ($DT_1$-$DT_0$) may be calculated for each logic device in the logic path. The output ramp for one logic device is the input ramp for the next logic device. The output ramps are separately calculated for both rising inputs and falling inputs.

To more fully illustrate how the present invention is practiced, an example is given below for the case of an inverter. In the example, three simulations are done with the input ramp and output load (LOAD) listed in Table 1 below:

TABLE 1

| INPUT RAMP | LOAD |
|---|---|
| .25 nS | 1 pF |
| .25 nS | 2 pF |
| 1 nS | 2 pF |

For the first two simulations input voltage (VINPUT) is given by the following Formula 9:

Formula 9

| | |
|---|---|
| VINPUT = 18.2 * TIME | For TIME < .25 nS |
| VINPUT = 4.55 | For TIME > .25 nS |

Similarly, for the third simulation, input voltage (VINPUT) is given by the following Formula 10:

Formula 10

| | |
|---|---|
| VINPUT = 4.55 * TIME | For TIME < 1 nS |
| VINPUT = 4.55 | For TIME > 1 nS |

In the above Formula 9 and Formula 10, TIME is measured from the beginning of the INPUT RAMP and VINPUT is measured in volts.

For each of the simulations, a linear approximation is made of the output of the simulated circuit. The linearization is done by a two point fit through times at which the output voltage is at 3.15 volts and at 1.4 volts. In the simulation, the results of the linearization are given by Table 2 below:

TABLE 2

| INPUT RAMP | LOAD | Time when OUTPUT = 3.15 V | Time when OUTPUT = 1.4 V |
|---|---|---|---|
| .25 nS | 1 pF | 1.027 nS | 2.107 nS |
| .25 nS | 2 pF | 1.806 nS | 3.911 nS |
| 1 nS | 2 pF | 2.289 nS | 4.394 nS |

Using linear approximation for the first simulation gives an output voltage (VOUTPUT) for the first simulation as given by Formula 11 below:

Formula 11

| | |
|---|---|
| VOUTPUT = 4.55 | For TIME < .163 nS |
| VOUTPUT = 4.55 − 4.55 * (TIME − .163)/(2.971 − .163) | For .163 nS < TIME < 2.971 nS |
| VOUTPUT = 0 | For TIME > 2.971 nS |

Using linear approximation for the second simulation gives an output voltage (VOUTPUT) for the second simulation as given by Formula 12 below:

Formula 12

| | |
|---|---|
| VOUTPUT = 4.55 | For TIME < .122 nS |
| VOUTPUT = 4.55 − 4.55 * (TIME − .122)/(5.595 − .122) | For .122 nS < TIME < 5.595 nS |
| VOUTPUT = 0 | For TIME > 5.595 nS |

Using linear approximation for the third simulation gives an output voltage (VOUTPUT) for the third simulation as given by Formula 13 below:

Formula 13

| | |
|---|---|
| VOUTPUT = 4.55 | For TIME < 0.605 nS |
| VOUTPUT = 4.55 − 4.55 * (TIME − 0.605)/(6.078 − 0.605) | For 0.605 nS < TIME < 6.078 nS |
| VOUTPUT = 0 | For TIME > 6.078 nS |

Values for $DT_0$ and $DT_1$ for the three simulations are extracted from the linear approximations as listed in Table 3 below:

TABLE 3

| INPUT RAMP | LOAD | $DT_0$ | $DT_1$ |
|---|---|---|---|
| .25 nS | 1 pF | .163 nS | 2.971 nS |
| .25 nS | 2 pF | .122 nS | 5.595 nS |
| 1 nS | 2 pF | .605 nS | 6.078 nS |

Now the values for $DT_0$ and $DT_1$ may be substituted into Formula 4 and Formula 5 to solve for coefficients $A_0$, $A_1$, B, $D_0$ and $D_1$. For example, substituting the values for INPUT RAMP, LOAD and $DT_0$ for the three simulations into Formula 4 gives the following equations:

$$0.163\ nS = A_0 + B*(0.25\ nS) + D_0*(1pF)$$

$$0.122\ nS = A_0 + B*(0.25\ nS) + D_0*(2pF)$$

$$0.605\ nS = A_0 + B*(1.0\ nS) + D_0*(2pF)$$

These three equations are solved for $A_0$, B, and $D_0$ to produce the following values:

$A_0 = 0.043$ $B = 0.644$ $D_0 = -0.041$

Similarly, substituting the values for INPUT RAMP, LOAD and $DT_1$ for the three simulations into Formula 5 gives the following equations:

$$2.971\ nS = A_1 + B*(0.25\ nS) + D_1*(1pF)$$

$$5.595\ nS = A_1 + B*(0.25\ nS) + D_1*(2pF)$$

$$6.078\ nS = A_1 + B*(1.0\ nS) + D_1*(2pF)$$

These three equations are solved for $A_1$, B, and $D_1$ to produce the following values:

$A_1 = 0.186$ $B = 0.644$ $D_1 = 2.624$

The first consistency check is done by noting that the coefficient B has the same value for the solutions of both Formula 4 and Formula 5. If two different values of B had been obtained, it would imply that at least one of the original simulations was not in the fast ramp region. The simulations would have to be redone with faster input ramps and/or larger output loads.

Now that the coefficients have been determined CIR may be calculated from Formula 8. For example, Formula 8 is simplified as below (remember that at CIR: INPUT RAMP= CIR):

$$CIR=½*(DT_0+DT_1)$$

$$CIR=½*DT_0+½*DT_1$$

$$CIR=½*[A_0+B*(\text{INPUT RAMP})+D_0*(\text{LOAD})]+½*[A_1+B*(\text{INPUT RAMP})+D_1*(\text{LOAD})]$$

$$CIR=½*(A_0+A_1)+½*(D_0+D_1)*(\text{LOAD})+B*(CIR)$$

$$CIR=½*[A_0+A_1+(D_0+D_1)*(\text{LOAD})]/(1-B)$$

Using the values for the coefficients $A_0$, $A_1$, B, $D_0$ and $D_1$ determined above, CIR has the value given in Formula 14 below:

$$CIR=0.322+3.628*(\text{LOAD}) \quad \text{Formula 14}$$

The second consistency check is done by checking to see whether the three simulations fall within fast input ramp region 174. For the two values for loads used in the three simulations, CIR is given by Table 4 below:

TABLE 4

| LOAD | CIR |
|------|-----|
| 1 pF | 3.950 nS |
| 2 pF | 7.578 nS |

The first simulation was done with a 1 pF load and an input ramp of 0.25 nS. Table 4 indicates this is within fast input ramp region 174. The second and third simulations were done with a 2 pF load and input ramp of 0.25 nS and 1 nS, respectively. Table 4 indicates these are also within fast input ramp region 174.

An additional circuit simulation of DC transfer curves and linear approximations is made to obtain the proportionality constant Z. In the circuit simulation, DC input voltages are found which cause output voltage to be 3.15 volts and 1.4 volts. The circuit simulation yields the values given in Table 5 below:

TABLE 5

| Output Voltage | Input Voltage |
|----------------|---------------|
| 3.15 V | 2.176 V |
| 1.40 V | 2.298 V |

Using linear approximations, the DC transfer curve is calculated as given in Formula 15 below:

Formula 15

| | |
|---|---|
| VOUTPUT = 4.55 | For VINPUT < 2.078 |
| VOUTPUT = 4.55 − 4.55 * (VINPUT − 2.078)/ (2.396 − 2.078) | For 2.078 < VINPUT < 2.396 |
| VOUTPUT = 0 | For VINPUT > 2.396 nS |

In the slow ramp region, a plot of $DT_0$ versus the input ramp is a straight line for a given output load. Z is the slope of that line and can be calculated from the DC transfer curve. In determining proportionality constant Z it is helpful to define the following breakpoints. Breakpoint $V^+$ is the value for VINPUT at which VOUTPUT reaches 4.55. Breakpoint $V^-$ is the value for VINPUT at which VOUTPUT reaches 0. For the present example, from Formula 15, it is seen that breakpoint $V^+$ is 2.078 volts and breakpoint $V^-$ is 2.396. Thus, proportionality constant Z may be calculated from Table 6 below:

TABLE 6

| VINPUT | VOUTPUT | Z |
|--------|---------|---|
| RISING | RISING | $(V^- - 0)/(4.55 - 0)$ |
| RISING | FALLING | $(V^+ - 0)/(4.55 - 0)$ |
| FALLING | RISING | $(4.55 - V^-)/(4.55 - 0)$ |
| FALLING | FALLING | $(4.55 - V^+)/(4.55 - 0)$ |

In the given example, the logic device is an inverter with input rising. Therefore, VINPUT is rising and VOUTPUT is falling. From Table 6, the value of proportionality constant is therefore:

$$Z=2.078/4.55=0.457$$

In the logic device library for the logic device, the values for coefficients $A_0$, $A_1$, B, $D_0$ and $D_1$ are stored. Additionally, the value for CIR from Formula 14 is stored and four values calculate from Table 6 are stored for proportionality constant Z. When calculating propagation delay through a first logic device, $DT_0$ of the first logic device is equal to the beginning of an input ramp for a second logic device following the first logic device. Similarly the value $(DT_1-DT_0)$ for the first logic device is equal to the input ramp for the second logic device. By determining $DT_0$ and $DT_1$ for each logic device and by using the value $(DT_1-DT_0)$ as an input ramp for a next logic device, the total propagation delay through circuitry is accomplished In the above example, the linear approximations assumed perfectly linear inputs. However, tails in the input waveform were not accounted for. The tail in the input waveform has a noticeable effect in fast input region 174; however, the tail in the input waveform has a negligible effect in slow input ramp region 174. To take account of this second order effect, two factors to adjust for the tails (FAT) may be included, one for rising inputs and one for falling inputs. To take these into account, Formula 4 and Formula 5 are modified resulting, respectively, in Formula 16 and Formula 17 given below:

$$DT_0=A_0+FAT*B*(\text{INPUT RAMP})+D_0*(\text{LOAD}) \quad \text{Formula 16}$$

$$DT_1=A_1+FAT*B*(\text{INPUT RAMP})+D_1*(\text{LOAD}) \quad \text{Formula 17}$$

Figure 7:
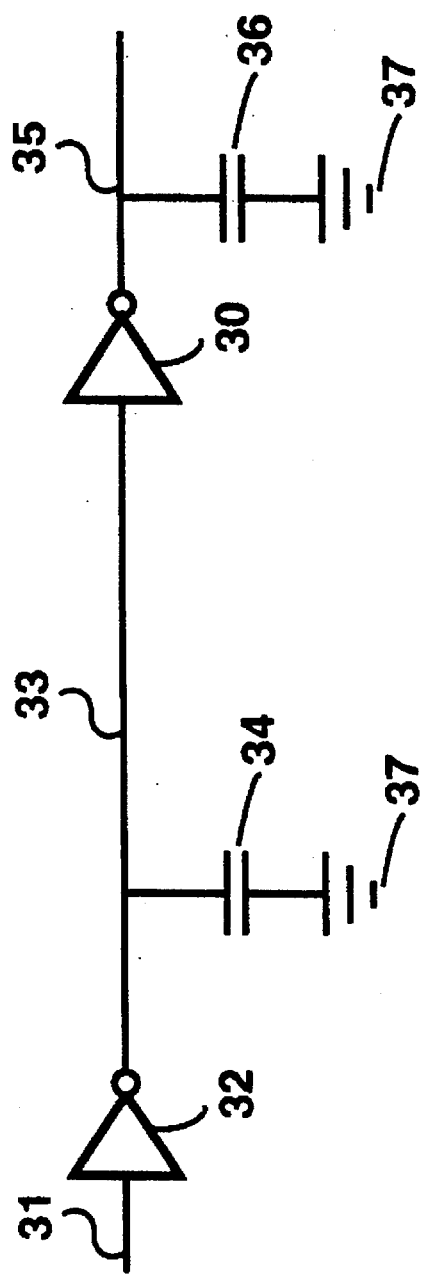
FIG. 7 shows a circuit used for a second order model simulation in accordance with the preferred embodiment of the present invention.

As in the above example, the value FAT may be determined by using circuit simulations. FIG. 7 shows a model used for circuit simulations for the second order model. Timing delay is modeled for an inverter 30. A capacitor 36 connected between an output 35 of inverter 30 and a ground 37 represents output load of inverter 30. A capacitor 34 connected between an input 33 of inverter 30 and ground 37 represents input load of inverter 30. An inverter 32 is used in order to place on input 33 of inverter 30 a realistic voltage, that is an input voltage with a tail.

Three simulations are performed using a falling (linear) input on an input 31 of inverter 32 with a ramp of 0.1 nS. The simulations are performed as the circuit simulations. The simulations are performed as described in the prior examples, with the exception each of the three simulations includes a simulation of both inverter 32 and inverter 30. In a first simulation, capacitance 34 (Cint) has a value of 0 pF and capacitance 35 (Cout) has a value of 1 pF. The first simulation of inverter 32 and linear approximation yields the following voltage (Vint) at input 33 of inverter 30, shown by Formula 18 below:

| Formula 18 | |
|---|---|
| Vint = 0 | For TIME < .064 nS |
| Vint = 4.55 * (TIME − .064)/(.395 − .064) | For .064 nS < TIME < .395 nS |
| Vint = 4.55 | For TIME > .395 nS |

The first simulation of inverter 30 and linear approximation yields the following voltage (Vout) at output 35 of inverter 30, shown by Formula 19 below:

| Formula 19 | |
|---|---|
| Vout = 4.55 | For TIME < .311 nS |
| Vout = 4.55 − 4.55 * (TIME − .311)/(3.126 − .311) | For .311 nS < TIME < 3.126 nS |
| Vout = 0 | For TIME > 3.126 nS |

In Formula 18 and Formula 19, TIME is measured from the beginning of the ramp on input 31 of inverter 32. Inverter 30, therefore, on input 33 sees an input transition that starts at 0.064 nS and ends at 0.395 nS. The output transition on output 35 of inverter 30 starts at 0.311 nS and ends at 3.126 nS. Thus the input ramp on input 33 of inverter 30 is 0.395 minus 0.064, that is 0.331 nS. Using the Formula 2, $DT_0$ is seen to be 0.311 minus 0.064, that is, 0.247 nS. Using Formula 3, $DT_1$ is seen to be 3.126 minus 0.064, that is, 3.062 nS. Table 7 below summarizes the results of all three simulations:

TABLE 7

| Cint | Cout | INPUT RAMP | $DT_0$ | $DT_1$ |
|---|---|---|---|---|
| 0 pF | 1 pF | .331 nS | .247 nS | 3.062 nS |
| 0 pF | 2 pF | .331 nS | .206 nS | 5.686 nS |
| .2 pF | 2 pF | .826 nS | .560 nS | 6.040 nS |

The above values are used to solve for the coefficients $a_0$, $a_1$, b, $d_0$ and $d_1$ in the following Formula 20 and Formula 21:

$$DT_0=a_0+b*(\text{INPUT RAMP})+d_0*(\text{Cout}) \quad \text{Formula 20}$$

$$DT_1=d_1+b*(\text{INPUT RAMP})+d_1*(\text{Cout}) \quad \text{Formula 21}$$

Formula 20 and Formula 21 uses the coefficients $a_0$, $a_1$, b, $d_0$ and $d_1$ because the values of the coefficients sometimes vary from the values of the coefficients $A_0$, $A_1$, B, $D_0$ and $D_1$ used in the first order model. As above, the values in Table 7 provide for three sets of equations for Formula 20 and Formula 21. Solving the three equations yields the following values:

$a_0=0.051$ $a_1=0.201$ $b=0.715$ $d_0=-0.041$ $d_1=2.624$

When these are compared with the values for $A_0$, $A_1$, B, $D_0$ and $D_1$ calculated above, it is seen that the values for $d_0$ and $d_1$ are equivalent to the values for $D_0$ and $D_1$, respectively. The values for $a_0$ and $a_1$ vary slightly from the values for $A_0$ and $A_1$, respectively. The most significant difference is between the value for b and the value for B. The value FAT is obtained by the ratio of b to B, as shown by Formula 22 below:

| Formula 22 |
|---|
| FAT = b/B |
| = .715/.644 |
| = 1.11 |

The value of Fat thus calculated is to be associated with rising transitions on input 33 of inverter 30. A second value of FAT, associated with falling transitions on input 33 of inverter 30, is calculated by repeating the above simulations and calculations using rising (linear) inputs on input 31 of inverter 32. Once calculated, the values for FAT are stored in the logic device library along with the values for the coefficients $A_0$, $A_1$, B, $D_0$ and $D_1$. The values for FAT are dependent on the process technology and do not depend on the logic design of a logic cell. Therefore, two entries for the value of FAT, one for rising input, the other for falling input, may be obtained from characterization of a single logic cell and stored for use for all logic cells in a cell library.

The value for CIR for the second order model may be recalculated from Formula 8, to be as set out in Formula 23 below:

$$CIR=\tfrac{1}{2}*[A_0+A_1+(D_0+D_1)*(\text{LOAD})]/(1-FAT*B) \quad \text{Formula 23}$$

Using the values for the coefficients $A_0$, $A_1$, B, $D_0$, $D_1$ and FAT determined above, CIR has the value given in Formula 24 below:

$$CIR=0.402+4.532*(\text{LOAD}) \quad \text{Formula 24}$$

Using the second order model, the following Formula 25 and Formula 26 are used to calculate $DT_0$ and $DT_1$ in slow input ramp region 175:

$$DT_0=DT_{0(CIR)}+Z*(\text{INPUT RAMP}-CIR) \quad \text{Formula 25}$$

$$DT_1=DT_{1(CIR)}+B*(\text{INPUT RAMP}-CIR) \quad \text{Formula 26}$$

In Formula 25, $DT_{0(CIR)}$ is the value of $DT_0$ at CIR. In Formula 26, $DT_{1(CIR)}$ is the value of $DT_1$ at CIR.

Once the logic device has been characterized, as above, it is possible to determine a value for $DT_0$ and $DT_1$ for any input ramp and load. For example, suppose the load (LOAD) is equal to 0.5 pF and the input ramp is equal to 0.25 nS. Then, using Formula 24, CIR has the following value:

$CIR=0.402+4.532*(\text{LOAD})$ $CIR=0.402+4.532*(0.5)$ $CIR=2.668 \ nS$

Since the input ramp (0.25 nS) is smaller than the CIR (2.668 nS), the example falls in fast input ramp region 174. Therefore, Formula 16 is used to calculate $DT_0$ and Formula 17 is used to calculate $DT_1$, as shown below:

$DT_0=A_0+FAT*B*(\text{INPUT RAMP})+D_0*(\text{LOAD})$ $DT_0=0.043+1.11*0.644*(0.25)-0.041*(0.5)$ $DT_0=0.201 \ nS$ $DT_1=A_1+FAT*B*(\text{INPUT RAMP})+D_1*(\text{LOAD})$ $DT_1=0.186+1.11*0.644*(0.25)+2.624*(0.5)$ $DT_1=1.677 \ nS$ As an alternate example, suppose the load (LOAD) is equal to 0.5 pF and the input ramp is equal to 3 nS. Then CIR still has the following value:

$CIR=0.402+4.532*(LOAD)$ $CIR=0.402+4.532*(0.5)$ $CIR=2.668 \ nS$

Since the input ramp (3 nS) is now larger than the CIR (2.668 nS), the example falls in slow input ramp region 175. Therefore, Formula 25 is used to calculate $DT_0$ and Formula 26 is used to calculate $DT_1$. First $DT_{0(CIR)}$ and $DT_{1(CIR)}$ are calculated as shown below:

$DT_{0(CIR)}=A_0+FAT*B*(CIR)+D_0*(LOAD)$ $DT_{0(CIR)}=0.043+1.11*0.644*(2.668)-0.041*(0.5)$ $DT_{0(CIR)}=1.930 \ nS$ $DT_{1(CIR)}=A_1+FAT*B*(CIR)+D_1*(LOAD)$ $DT_{1(CIR)}=0.186+1.11*0.644*(2.668)+2.624*(0.5)$ $DT_{1(CIR)}=3.406 \ nS$

Once $DT_{0(CIR)}$ and $DT_{1(CIR)}$ have been calculated, Formula 25 is used to calculate $DT_0$ and Formula 26 is used to calculate $DT_1$, as shown below:

$DT_0=DT_{0(CIR)}+Z*(INPUT \ RAMP-CIR)$ $DT_0=1.930+0.457*(3-2.668)$ $DT_0=2.082 \ nS$ $DT_1=DT_{1(CIR)}+B*(INPUT \ RAMP-CIR)$ $DT_1=3.406+0.644*(3-2.668)$ $DT_1=3.620 \ nS$

As discussed above the input ramp for the following logic device is equal to $DT_1-DT_0$.

When characterizing different logic cells for a cell library, it is desirable to take into account process, temperature and power supply variations. In the preferred embodiment of the present invention, this is done by the use of scaling factors.

For example, for an input slope model (i.e., a model in which the timing of a cell depends upon the ramp of the input signal which is driving it), scaling factors may be determined as follows:

For delays, the input slope model is defined by the following Formulae 27 below:

---
Formulae 27
---

$DT_0 = A_0 + D_0 * (LOAD) + FAT * B \ Min(INPUT \ RAMP, CIR) + Z * Max(0, INPUT \ RAMP - CIR)$
$DT_1 = A_1 + D_1 * (LOAD) + FAT * B * Min(INPUT \ RAMP, CIR) + B * Max(0, INPUT \ RAMP - CIR)$

---

Min (INPUT RAMP, CIR) is equal to whichever of INPUT RAMP and CIR has the smaller value. Max (0, INPUT RAMP–CIR) is equal to whichever VLSI Technology, Inc. of 0 and INPUT RAMP–CIR has the larger value. For the above Formula 27, the critical input ramp (CIR) is determined by Formula 28 below:

$CIR=½*[A_0+A_1+(D_0+D_1)*(LOAD)]/[1-FAT*B]$  Formula 28

As described above, the values of the parameters $A_0$, $A_1$, B, $D_0$, $D_1$ and Z can be characterized for a particular set of conditions (e.g., temperature, voltage, process conditions, foundry) for a complete cell library. In addition, the parameter FAT is obtained at the same set of conditions by the procedure described above. Then, in accordance with the preferred embodiment of the present invention, for a different set of conditions the new parameters can be approximately determined in terms of the old parameters and thirteen scaling parameters ($\alpha$, $\Delta\alpha+$, $\Delta\alpha-$, $\beta+$, $\beta-$, $\delta+$, $\delta-$, $\Delta\delta+$, $\Delta\delta-$, $\zeta+$, $\zeta-$, $\phi+$ and $\phi-$), using formulae 29 listed below:

---
Formulae 29
---

$A_0' = \alpha * A_0$
$A_1' - A_0' = \Delta\alpha+ * (A_1 - A_0)$ or
$A_1' - A_0' = \Delta\alpha- * (AI - A_0)$
$B' = \beta+ * B$ or $B' = \beta- * B$
$D_0' = \delta+ * D_0$ or $D_0' = \delta- * D_0$
$D_1' - D_0' = \Delta\delta+ * (D_1 - D_0)$ or
$D_1' - D_0' = \Delta\delta- * (D_1 - D_0)$
$Z' = \zeta+ * Z$ or $Z' = \zeta- * Z$
$FAT' = \phi+ * FAT$ or $FAT' = \phi- * FAT$.

---

In Formulae 29 above, the parameters at the new conditions are written with primes ('s). $\beta+$, $\delta+$ and $\phi+$ are used for rising input transition, whereas $\beta-$, $\delta-$ and $\phi+$ are used for falling input transition. Likewise, $\Delta\alpha+$, $\delta+$ and $\Delta\delta+$ are used for rising output transition, whereas $\Delta\alpha-$, $\delta-$ and $\Delta\delta-$ are used for falling output transition. In the preferred embodiment, the same value of the scaling parameters are used for every cell and for every input and output pin whereas the values of the parameters $A_0$, $A_1$, B, $D_0$, $D_1$, and Z will depend upon the particular cell and the input and output pins. In addition, the same values of FAT are used for every cell and for every input pin and output pin.

In the preferred embodiment of the present invention, the scaling factors, except for $\alpha$ are determined by characterizing an inverter at the new conditions. For example, $\Delta\alpha+$ can be determined by the following Formula 30

$\Delta\alpha+=(A_1'-A_0')/(A_1-A_0)$  Formula 30

In Formula 30, $A_1'$ and $A_0'$ are the values obtained for rising output at the new conditions, and $A_1$ and $A_0$ are the values at the baseline conditions. The parameter $\alpha$ can be determined by characterizing any cell with at least three stages between input and output pins. In the preferred embodiment an eight input NOR gate is used. To determine $\alpha$, the 16 values (8 input pins, rising and falling input direction) of the ratio of $A_0'$ and $A_0$ are found and an average is taken. Alternately, the average of values for rising and falling transitions for a single input pin or any number of input pins is taken.

For logic cells which have set-up and hold conditions (e.g., flip-flops), the model for minimum set-up time is given by formula 31 below:

Min Set-Up Time$=A_{set-up}-FAT*B_{clock}*$(Clock Ramp)$+$
$FAT*B_{data}*$(Data Ramp)  Formula 31

In Formula 31, the set-up time is measured between the start of the data transition and the start of the clock transition. There is a similar expression for the minimum hold time.

This is given in Formula 32 below:

$$\text{Min Hold Time} = A_{hold} + FAT * B_{clock} * (\text{Clock Ramp}) - FAT * B_{data} * (\text{Data Ramp}) \quad \text{Formula 32}$$

The parameters at the new conditions are obtained in terms of the parameters at the old conditions by Formulae 33 given below:

---
Formulae 33
---

$A_{set-up}' = \alpha * A_{set-up}$
$B_{clock}' = \beta + * B_{clock}$ or $B_{clock}' = \beta - * B_{clock}$
$B_{data}' = \beta + * B_{data}$ or $B_{data}' = \beta - * B_{data}$

---

In Formulae 33 above, either $\beta+$ or $\beta-$ is used dependent upon the direction of the transition. The values of $\alpha, \beta+$ and $\beta-$ are the same as those for combinational logic gates. The analogous expressions are to be used for scaling of minimum hold times. If the clock ramp is not varied during the characterization of the library the value of $B_{clock}$ should be taken the same as the value of B obtained for clock-to-q.

In the preferred embodiment of the present invention, the scaling parameters for the input slope modeling system may be calculated as follows. Once a cell library has been characterized at a baseline set of conditions (temperature, power supply, process). Then, at a different set of conditions, the timing models can be determined from the baseline parameters and thirteen (cell independent) scaling parameters ($\alpha$, $\Delta\alpha+$, $\Delta\alpha-$, $\beta+$, $\beta-$, $\delta+$, $\delta-$, $\Delta\delta+$, $\Delta\delta-$, $\zeta+$, $\zeta-$, $\phi+$ and $\phi-$). Each of the parameters is a product of three terms, one each for temperature, power supply, and process condition. For example, $\alpha$ may be broken down is in Formula 34 below:

$$\alpha = \alpha_{Temp} * \alpha_{Vdd} * \alpha_{Process} \quad \text{Formula 34}$$

The temperature dependence is determined by a linear function of the temperature as in Formula 35 below:

$$\alpha_{Temp} = 1 + K\alpha_{Temp} * (T - T_{baseline}) \quad \text{Formula 35}$$

The power supply dependence is given by a linear relation of $Vdd^{-3/2}$ as in Formula 36 below:

$$\alpha_{Vdd} 1 + K\alpha_{Vdd} * (Vdd^{-3/2} - Vdd_{baseline}^{-3/2}) \quad \text{Formula 36}$$

The process dependence is given by three numbers, one for typical, one for best case, and one for worst case.

The determination of the parameters requires the characterization of two cells and the FAT factor at several temperature, power supply, and process conditions. In the preferred embodiment, an inverter and an eight input NOR gate are used, as set out above. The eight input NOR gate is used for high load conditions only and needs to have at least three stages between input and output. Only a single input pin of the logic NOR gate need be used. If the logic NOR gate for the system does not have at least three stages, a different combinatorial logic cell with at least three stages is used instead. The parameters $\beta+$, $\beta-$, $\delta+$, $\delta-$, $\Delta\delta+$, $\Delta\delta-$, $\zeta+$ and $\zeta-$, are determined using the inverter. The parameter s is determined from the eight input logic NOR gate. In order to determine which cell is to be used to determine $\Delta\alpha+$ and $\Delta\alpha-$, $A_1-A_0$ is calculated for the two cells. The cell for which $A_1-A_0$ is larger at the baseline condition is used to determine $\Delta\alpha+$ and $\Delta\alpha-$. The parameters $\phi+$ and $\phi-$ are to be determined by a ratio of the FAT factors.

For example, $\Delta\delta+$ is determined as follows. $\Delta\delta+$ refers to the ratio of $D_1-D_0$ for output rising. The numbers listed below come from simulations of an inverter cell of a 0.8 micron standard cell library. The baseline characterization of the library is performed at typical process conditions: T=26 degrees Celsius, and Vdd=3.1 V. The scaling includes best and worst case process conditions, temperatures between 26 and 70 degrees Celsius and Vdd between 2.6 V and 3.6 V.

First consider the variation with respect to process condition. The inverter is characterized with typical (typ), fast (ff), and slow (ss) models, each at baseline power supply and temperature conditions. The results are summarized in Table 8 below:

TABLE 8

| Model | $D_0$ | $D_1$ | $D_1 - D_0$ | $(D_1 - D_0)/(D_1 - D_0)$ baseline |
|---|---|---|---|---|
| typ | −0.029 | 2.174 | 2.203 | 1.000 |
| ff  | −0.023 | 1.373 | 1.396 | 0.634 |
| ss  | −0.037 | 3.347 | 3.384 | 1.536 |

This table yields $\Delta\delta+$ (Process)=1.000 for typ, 0.634 for ff, and 1.536 for ss. The temperature variation is considered next. The parameter $K\Delta\delta+$ (Temperature) is determined by a least squares fit as illustrated by the following steps. In a first step, the logic inverter is characterized at varying temperature with baseline power supply and process conditions. In a second step, for each temperature, the ratio $(D_1-D_0)/(D_1-D_0)$baseline is calculated. This ratio is called "r". $T-T_0$ (the difference of the temperature and the baseline temperature) is also calculated. In a third step, for each temperature, the product of $r-1$ and $T-T_0$ is calculated. The results are summed over various temperatures. In a fourth step, for each temperature, square of $T-T_0$ is calculated. The results are summed over the various temperatures. In a fifth step, $K\Delta\delta+_{Temp}$ is obtained by dividing the result of step 3 by the result of step 4.

The results for a 0.8 micron standard cell library are summarized in Table 9 below:

TABLE 9

| Temp | r | $(r - 1) * (T - T_0)$ | $(T - T_0)^2$ |
|---|---|---|---|
| 26 | 1.000 | 0.000 | 0 |
| 37 | 1.045 | 0.495 | 121 |
| 48 | 1.088 | 1.936 | 484 |
| 59 | 1.133 | 4.389 | 1089 |
| 70 | 1.177 | 7.788 | 1936 |
| Sum |   | 14.608 | 3630 |

In the above example, the parameter $K\Delta\delta+_{Temp}$ is thus equal to 14.608/3630=0.00402.

In the preferred embodiment of the present invention, the power supply variation is calculated as follows. The parameter $K\Delta\delta+_{Vdd}$ is determined using the following method steps. In a first step, the inverter is characterized at varying power supply with baseline temperature and process conditions. In a second step, for each power supply, the ratio $(D_1-D_0)/(D_1-D_0)$baseline is calculated. This ratio is called r. Also calculated is $\delta_{Vdd}^{-3/2}$, defined to be equal to $Vdd^{-3/2} - Vdd_{baseline}^{-3/2}$. In a third step, for each power supply, the product of $r-1$ and $\delta_{Vdd}^{-3/2}$ are calculated. The results are summed over the various power supplies. In a fourth step, for each power supply, the square of $\delta_{Vdd}^{-3/2}$ are calculated. The results are summed over the various power supplies. In a fifth step, $K\Delta\delta+_{Vdd}$ is obtained by dividing the result of step 3 by the result of step 4.

The results for a 0.8 micron standard cell library are summarized in Table 10 below:

TABLE 10

| Vdd | Vdd$^{-3/2}$ | δVdd$^{-3/2}$ | r − 1 | (r − 1) * δVdd$^{-3/2}$ | (δVdd$^{-3/2}$)$^2$ |
|---|---|---|---|---|---|
| 2.60 | .2385 | .0553 | 0.263 | .01454 | .003058 |
| 2.85 | .2078 | .0246 | 0.112 | .00276 | .000605 |
| 3.10 | .1832 | .0000 | 0.000 | .00000 | .000000 |
| 3.35 | .1631 | −.0201 | −0.085 | .00171 | .000404 |
| 3.60 | .1464 | −.0368 | −0.152 | .00559 | .001354 |
| Sum | | | | .02460 | .005421 |

In the above example, the parameter KΔδ+$_{Vdd}$ is thus equal to 0.02460/0.005421=4.538.

The remaining scaling parameters (α, Δα+, Δα−, β+, β−, δ−, Δδ+, Δδ−, ζ+, ζ−, φ+ and φ−) are determined using the same methodology incorporating the following rules listed in Table 11 below:

TABLE 11

| Scaling Parameter | Input or Output Direction | Cell | Ratio of |
|---|---|---|---|
| α | Average | Multistage | A$_0$ |
| Δα+ | Output Rising | Inverter | A$_1$ − A$_0$ |
| Δα− | Output Falling | Inverter | A$_1$ − A$_0$ |
| β+ | Input Rising | Inverter | B |
| β− | Input Falling | Inverter | B |
| δ+ | Output Rising | Inverter | D$_0$ |
| δ− | Output Falling | Inverter | D$_0$ |
| Δδ+ | Output Rising | Inverter | D$_1$ − D$_0$ |
| Δδ− | Output Falling | Inverter | D$_1$ − D$_0$ |
| ζ+ | Input Rising | Inverter | Z |
| ζ− | Input Falling | Inverter | Z |
| φ+ | Input Rising | | FAT |
| φ− | Input Falling | | FAT |

In the preferred embodiment of the present invention, after extracting the scaling parameters, a check is made to make sure the values are reasonable. For example, generally, B, FAT and Z should not be very sensitive to process, temperature, and power supply changes whereas the other parameters are much more sensitive For example, B+, B−, δ+, δ−, φ+ and φ− are expected to be close to one whereas the other scaling parameters will be much further from one.

The foregoing discussion discloses and describes merely exemplary methods and embodiments of the present invention. As will be understood by those familiar with the art, the invention may be embodied in other specific forms without departing from the spirit or essential characteristics thereof. For example, the present invention may be implemented by a computer. Accordingly, the disclosure of the present invention is intended to be illustrative, but not limiting, of the scope of the invention, which is set forth in the following claims.

I claim:

1. A method to aid in designing integrated circuits, the method comprising the steps of:
   (a) providing a cell library including the following substeps:
      (a.1) obtaining parameters for each logic cell in the cell library, the parameters defining propagation delay through each logic cell based on output load and input ramp when the logic cell operates at baseline conditions, parameters for each logic cell being obtained by individually characterizing the logic cell at the baseline conditions to obtain parameters specific to that logic cell, wherein the parameters define propagation delay through each logic cell in accordance with the following:
         (a.1.1) when the logic device operates in a fast input ramp region in which an input ramp to the logic device is completely switched before the output signal wave form changes significantly, the parameters are used in a first formula to obtain a first value, the first value representing delay through the logic device, and
         (a.1.2) when the logic device operates in a slow input ramp region in which the input ramp switches so slowly that the output signal switches while the input ramp is still switching, the parameters are used in a second formula to obtain the first value, the second formula being different than the first formula; and,
      (a.2) obtaining scaling parameters for the logic cells in the cell library, the scaling parameters modifying values of the parameters for the logic cells within the library in order to approximate changes in propagation delay through each logic cell resulting from changes in the baseline conditions, wherein the scaling parameters are obtained by characterizing a subset of the logic cells at conditions varying from the baseline conditions, the scaling parameters thus obtained being used for all logic cells in the cell library, including logic cells not within the subset of logic cells used to obtain the scaling parameters.

2. A method as in claim 1 wherein in substep (a.2) the conditions varying from the baseline conditions includes a change in at least one of operating temperature, power supply voltage and process conditions.

3. A method as in claim 1 wherein the subset of the logic cells in substep (a.2) includes an inverter.

4. A method as in claim 1 wherein the first formula has a form as follows:

$$DT=A+B*(INPUT\ RAMP)+D*(LOAD)$$

where DT represents the first value, INPUT RAMP represents duration of the input ramp, LOAD represents capacitive load driven by the logic device, and A, B and D are coefficients determined using circuit simulations.

5. A method as in claim 1 wherein the second formula has a form as follows:

$$DT=A+B*(CIR)+D*(LOAD)+Z*(INPUT\ RAMP-CIR)$$

wherein CIR represents INPUT RAMP at the border between the fast input ramp region and the slow input ramp region for the LOAD, and Z is a determined using circuit simulations.

6. A method as in claim 1 wherein the first formula has a form as follows:

$$DT=A+FAT*B*(INPUT\ RAMP)+D*(LOAD)$$

wherein DT represents the first value, INPUT RAMP represents duration of the input ramp, LOAD represents capacitive load driven by the logic device, and A, B, D and FAT are coefficients determined using circuit simulations.

7. A method as in claim 6 wherein the second formula has a form as follows:

$$DT=DT_{(CIR)}+Z*(INPUT\ RAMP-CIR)$$

wherein CIR represents INPUT RAMP at the border between the fast input ramp region and the slow input ramp region for the LOAD, Z is a coefficient determined using circuit simulations, and DT$_{(CIR)}$ is the first value when the logic ramp has an input ramp equal to CIR and a load equal to LOAD.

8. A method to aid in designing integrated circuits, the method comprising the steps of:
- (a) providing a cell library including the following substeps:
  - (a.1) obtaining parameters for each logic cell in the cell library, the parameters defining propagation delay through each logic cell based on output load and input ramp when the logic cell operates at baseline conditions, parameters for each logic cell being obtained by individually characterizing the logic cell at the baseline conditions to obtain parameters specific to that logic cell, wherein the parameters define propagation delay through each logic cell for two separate values of propagation delay, a first value representing propagation delay through the logic cell, a second value representing duration from a beginning of the input ramp of the logic device to an end of an output ramp of the logic device, the first value and the second value being based on the length of the input ramp to the logic device and the amount of the load driven by the logic device, in accordance with the following:
    - (a.1.1) when the logic device operates in a fast input ramp region in which an input ramp to the logic device is completely switched before the output signal wave form changes significantly, the parameters are used in a first formula to obtain the first value, the first value representing delay through the logic device,
    - (a.1.2) when the logic device operates in a slow input ramp region in which the input ramp switches so slowly that the output signal switches while the input ramp is still switching, the parameters are used in a second formula to obtain the first value, the second formula being different than the first formula,
    - (a.1.3) when the logic device operates in the fast input ramp region, the parameters are used in a third formula to generate the second value, and
    - (a.1.4) when the logic device operates in the slow input ramp region, the parameters are used in a fourth formula to generate the second value, the fourth formula being different from the third formula; and,
  - (a.2) obtaining scaling parameters for the logic cells in the cell library, the scaling parameters modifying values of the parameters for the logic cells within the library in order to approximate changes in propagation delay through each logic cell resulting from changes in the baseline conditions, wherein the scaling parameters are obtained by characterizing a subset of the logic cells at conditions varying from the baseline conditions, the scaling parameters thus obtained being used for all logic cells in the cell library, including logic cells not within the subset of logic cells used to obtain the scaling parameters.

9. A method as in claim 8 wherein the first formula has a form as follows:

$$DT_0 = A_0 + B*(\text{INPUT RAMP}) + D_0*(\text{LOAD})$$

where $DT_0$ represents the first value, INPUT RAMP represents duration of the input ramp, LOAD represents capacitive load driven by the logic device, and $A_0$, $B$ and $D_0$ are coefficients determined using circuit simulations.

10. A method as in claim 9 wherein the third formula has a form as follows:

$$DT_1 = A_1 + B*(\text{INPUT RAMP}) + D_1*(\text{LOAD})$$

where $DT_1$ represents the second value, and $A_1$ and $D_1$ are coefficients determined using circuit simulations.

11. A method as in claim 10 wherein the second formula has a form as follows:

$$DT_0 = A0 + B*(CIR) + D_0*(\text{LOAD}) + Z*(\text{INPUT RAMP} - CIR)$$

wherein CIR represents INPUT RAMP at the border between the fast input ramp region and the slow input ramp region for the LOAD, and Z is determined using circuit simulations.

12. A method as in claim 11 wherein the fourth formula has a form as follows:

$$DT_1 = A_1 + B*(\text{INPUT RAMP}) + D_1*(\text{LOAD}).$$

13. A method as in claim 8 wherein the first formula has a form as follows:

$$DT_0 = A_0 + FAT*B*(\text{INPUT RAMP}) + D_0*(\text{LOAD})$$

wherein $DT_0$ represents the first value, INPUT RAMP represents duration of the input ramp, LOAD represents capacitive load driven by the logic device, and $A_0$, $B$, $D_0$ and FAT are coefficients determined using circuit simulations.

14. A method as in claim 13 wherein the third formula has a form as follows:

$$DT_1 = A_1 + FAT*B*(\text{INPUT RAMP}) + D_1*(\text{LOAD})$$

wherein $DT_1$ represents the second value, and $A_1$ and $D_1$ are coefficients determined using circuit simulations.

15. A method as in claim 14 wherein the second formula has a form as follows:

$$DT_0 = DT_{0(CIR)} + Z*(\text{INPUT RAMP} - CIR)$$

wherein CIR represents INPUT RAMP at the border between the fast input ramp region and the slow input ramp region for the LOAD, Z is a coefficient determined using circuit simulations, and $DT_{(CIR)}$ is the first value when the logic ramp has an input ramp equal to CIR and a load equal to LOAD.

16. A method as in claim 15 wherein the fourth formula has a form as follows:

$$DT_1 = DT_{1(CIR)} + B*(\text{INPUT RAMP} - CIR).$$

17. A method as in claim 8 wherein the first formula has a form as follows:

$$DT_0 = A_0 + D_0*(\text{LOAD}) + FATB\text{Min}(\text{INPUT RAMP}, CIR) + Z*\text{Max}(0, \text{INPUT RAMP} - CIR)$$

and the second formula has a form as follows:

$$DT_1 = A_1 + D_1*(\text{LOAD}) + FAT*B*\text{Min}(\text{INPUT RAMP}, CIR) + B*\text{Max}(0, \text{INPUT RAMP} - CIR).$$

where $DT_0$ represents the first value, $DT_1$ represents the second value, INPUT RAMP represents duration of the input ramp, LOAD represents capacitive load driven by the logic device, CIR represents INPUT RAMP at the border between the fast input ramp region and the slow input ramp region for the LOAD, and $A_0$, $A_1$, $B$, $Z$, $D_0$, $D_1$ and FAT are coefficients determined using circuit simulations.

18. A method as in claim 17 wherein in substep (a.2) the scaling parameters include at least one of the following scaling parameters: $\alpha$, $\Delta\alpha+$, $\Delta\alpha-$, $\beta+$, $\beta-$, $\delta+$, $\delta-$, $\Delta\delta+$, $\Delta\delta-$, $\zeta+$ and $\zeta-$; where the scaling parameters are defined as in the following formulae:

$$A_0'=\alpha*A_0$$

$$A_1'-A_0'=\Delta\alpha+*(A_1-A_0) \text{ or } A_1'-A_0'=\Delta\alpha-*(A1-A_0)$$

$$B'=\beta+*B \text{ or } B'=\beta-*B$$

$$D_0'=\delta+*D_0 \text{ or } D_0'=\delta-*D_0$$

$$D_1'-D_0'=\Delta\delta+*(D_1-D_0) \text{ or } D_1'-D_0'=\Delta\delta-*(D_1-D_0)$$

$$Z'=\zeta+*Z \text{ or } Z'=\zeta-*Z.$$

$$FAT'=\phi+*FAT \text{ or } FAT'=\phi-*FAT.$$

wherein $A_0'$, $A_1'$, $B'$, $D_0'$, $D_1'$, $Z'$ and $FAT'$ are new parameters resulting from the changes in the baseline conditions.

19. A method as in claim 18 wherein the scaling factors $\Delta\alpha+$, $\Delta\alpha-$, $\beta+$, $\beta-$, $\delta+$, $\delta-$, $\Delta\delta+$, $\Delta\delta-$, $\zeta+$ and $\zeta-$ are determined by characterizing an inverter.

20. A method as in claim 19 wherein the scaling factor $\alpha$ is characterized using a logic cell with at least four stages between input and output pins.

21. A method as in claim 20 wherein $\alpha$ is determined using a ratio of $A_0$ at different conditions, $\Delta\alpha+$ is determined using a ratio of $A1-A_0$ at different conditions, $\Delta\alpha-$ is determined using a ratio of $A1-A_0$ at different conditions, $\beta+$ is determined using a ratio of B at different conditions, $\beta-$ is determined using a ratio of B at different conditions, $\delta+$ is determined using a ratio of $D_0$ at different conditions, $\delta-$ is determined using a ratio of $D_0$ at different conditions, $\Delta\delta+$ is determined using a ratio of $D1-D_0$ at different conditions, $\Delta\delta-$ is determined using a ratio of $D1-D_0$ at different conditions, $\zeta+$ is determined using a ratio of Z at different conditions, $\zeta-$ is determined using a ratio of Z at different conditions, a scaling parameter $\phi+$ is determined using a ratio of FAT at different conditions, and a scaling parameter $\phi-$ is determined using a ratio of FAT at different conditions.

22. A method as in claim 17 wherein each of the scaling parameters is a product of three terms, the three terms being a first term for temperature, a second term for power supply and a third term for process condition.

23. A method as in claim 22 wherein CIR is determined by the following formula:

$$CIR=\tfrac{1}{2}[A_0+A_1+(D_0+D_1)*(LOAD)]/[1-FAT*B].$$

* * * * *